(12) United States Patent
Glarvey et al.

(10) Patent No.: US 9,853,190 B2
(45) Date of Patent: Dec. 26, 2017

(54) CADMIUM-FREE QUANTUM DOT NANOPARTICLES

(71) Applicant: Nanoco Technologies Ltd., Manchester (GB)

(72) Inventors: Paul Anthony Glarvey, Stockport (GB); James Harris, Manchester (GB); Steven Daniels, Derbyshire (GB); Nigel Pickett, Manchester (GB); Arun Narayanaswamy, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 0 days.

(21) Appl. No.: 14/579,237

(22) Filed: Dec. 22, 2014

(65) Prior Publication Data

US 2015/0194577 A1 Jul. 9, 2015

Related U.S. Application Data

(60) Provisional application No. 61/924,031, filed on Jan. 6, 2014.

(51) Int. Cl.
*H01L 21/20* (2006.01)
*H01L 33/50* (2010.01)
(Continued)

(52) U.S. Cl.
CPC ............ *H01L 33/502* (2013.01); *B01J 13/02* (2013.01); *B22F 1/0018* (2013.01); *B22F 1/02* (2013.01);
(Continued)

(58) Field of Classification Search
CPC ................ C01P 2004/64; H01L 33/502; Y10S 977/774; B82Y 40/00
See application file for complete search history.

(56) References Cited

U.S. PATENT DOCUMENTS 7,588,828 B2 * 9/2009 Mushtaq ............... C01B 25/082
427/212
7,803,423 B2 9/2010 O'Brien et al.
(Continued)

FOREIGN PATENT DOCUMENTS

CN 102973510 A 3/2013
WO 2010015824 A1 2/2010
(Continued)

OTHER PUBLICATIONS

Ung Thi Dieu Thuy et al: "Luminescence properties of In(Zn)P alloy core/ZnS shell, quantum dots" Applied Physics Letters, vol. 97, No. 19,Jan. 1, 2010 (Jan. 1, 2010) , p. 193104, XP055004346, ISSN: 0003-6951, DOI: 10.1063/1.3515417 pp. 193104-1, left-hand column, lines 8,12,13 , 27-33 pp. 193104-1, right-hand column, Lines 6-10.
(Continued)

Primary Examiner — Syed Gheyas
(74) Attorney, Agent, or Firm — Blank Rome, LLP

(57) ABSTRACT

Quantum dot semiconductor nanoparticle compositions that incorporate ions such as zinc, aluminum, calcium, or magnesium into the quantum dot core have been found to be more stable to Ostwald ripening. A core-shell quantum dot may have a core of a semiconductor material that includes indium, magnesium, and phosphorus ions. Ions such as zinc, calcium, and/or aluminum may be included in addition to, or in place of, magnesium. The core may further include other ions, such as selenium, and/or sulfur. The core may be coated with one (or more) shells of semiconductor material. Example shell semiconductor materials include semiconductors containing zinc, sulfur, selenium, iron and/or oxygen ions.

5 Claims, 2 Drawing Sheets

(51) Int. Cl.
| | |
|---|---|
| C01B 25/08 | (2006.01) |
| H01L 33/00 | (2010.01) |
| B22F 1/00 | (2006.01) |
| B22F 9/24 | (2006.01) |
| C09C 3/06 | (2006.01) |
| C09K 11/62 | (2006.01) |
| B22F 1/02 | (2006.01) |
| B01J 13/02 | (2006.01) |
| C09K 11/64 | (2006.01) |
| C09K 11/70 | (2006.01) |
| C09B 67/02 | (2006.01) |
| B82Y 20/00 | (2011.01) |
| B82Y 40/00 | (2011.01) |

(52) U.S. Cl.
CPC .............. B22F 9/24 (2013.01); C01B 25/088 (2013.01); C09B 67/0097 (2013.01); C09C 3/063 (2013.01); C09K 11/62 (2013.01); C09K 11/623 (2013.01); C09K 11/64 (2013.01); C09K 11/70 (2013.01); H01L 33/005 (2013.01); B82Y 20/00 (2013.01); B82Y 40/00 (2013.01); C01P 2002/84 (2013.01); C01P 2004/64 (2013.01); C01P 2006/40 (2013.01); C01P 2006/60 (2013.01); H01L 2933/0041 (2013.01); Y10S 977/774 (2013.01); Y10S 977/892 (2013.01)

(56) References Cited

U.S. PATENT DOCUMENTS

| | | | |
|---|---|---|---|
| 7,935,419 B1 | 5/2011 | Hollingsworth et al. | |
| 7,985,446 B2 | 7/2011 | O'Brien et al. | |
| 8,062,703 B2 | 11/2011 | O'Brien et al. | |
| 8,597,730 B2 | 12/2013 | Pickett et al. | |
| 2006/0029792 A1* | 2/2006 | Chen ...................... | B82Y 10/00 428/323 |
| 2008/0220593 A1* | 9/2008 | Pickett ................... | B82Y 30/00 438/478 |
| 2009/0212258 A1* | 8/2009 | McCairn ............... | C07C 51/367 252/301.36 |
| 2010/0159248 A1 | 6/2010 | Jang et al. | |
| 2010/0283005 A1 | 11/2010 | Pickett et al. | |
| 2012/0025139 A1* | 2/2012 | Taylor ................. | C09K 11/623 252/301.6 R |

FOREIGN PATENT DOCUMENTS

| | | |
|---|---|---|
| WO | 2012002780 A2 | 1/2015 |
| WO | 2011036447 A1 | 10/2017 |

OTHER PUBLICATIONS

Paul Mushonga et al: "Indium Phosphide-Based Semiconductor Nanocrystals and Their Applications", Journal of Nanomaterials, vol. 6, No. 8, Jan. 1, 2012 (Jan. 1, 2012), pp. 925-11, XP055189811, ISSN: 1687-4110, DOI: 10.1021/ja903558r p. 3, left-hand column, line 32—right-hand column, line 6 p. 3, right-hand column, line 32—p. 4, left-hand column, line 2.

Liang Li et al: "One-pot Synthesis of Highly Luminescent InP/ZnS Nanocrystals without Precursor Injection", Journal of the American Chemical Society, American Chemical Society, US, vol. 130, No. 35, Jan. 1, 2008 (Jan. 1, 2008), pp. 11588-11589, XP002637294, ISSN: 0002-7863, DOI: 10.1021/JA803687E [retrieved on Aug. 8, 2008] p. 11588, left-hand column, lines 29-32, 46-49.

Kai Huang et al: "Internal Structure of InP/ZnS Nanocrystals unraveled by High-Resolution Soft X-ray Photoelectron Spectroscopy", ACS Nano, vol. 4, No. 8, Aug. 24, 2010 (Aug. 24, 2010), pp. 4799-4805, XP055190202, ISSN: 1936-0851, DOI: 10.1021/nn100581t the whole document.

Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.

Kim, S., et al., (2011), "Reverse Type-I ZnS/InP/ZnS Core/Shell/Shell Nanocrystals: Cadmium-Free Quantum Dots for Visible Luminescence", Small, vol. 7, No. 1., pp. 70-73.

Kiao, Q., et al., (2008), "Synthesis and photoluminescence of water-soluble Mn:ZnS/ZnS core/shell quantum dots using nucleation-doping strategy", Optical Materials 31, pp. 455-460.

* cited by examiner

CADMIUM-FREE QUANTUM DOT NANOPARTICLES

CROSS-REFERENCE TO RELATED APPLICATIONS

This application claims the benefit of U.S. Provisional Application No. 61/924,031 filed on Jan. 6, 2014.

STATEMENT REGARDING FEDERALLY SPONSORED RESEARCH OR DEVELOPMENT

Not Applicable

BACKGROUND OF THE INVENTION

1. Field of the Invention

The present invention generally relates to quantum dot nanoparticles. More particularly, it relates to the synthesis of quantum dot nanoparticles containing no cadmium or other heavy metals.

2. Description of the Related Art including information disclosed under 37 CFR 1.97 and 1.98

There has been substantial interest in the preparation and characterization of compound semiconductor particles with dimensions in the order of 2-100 nm, often referred to as quantum dots (QDs) and/or nanocrystals. This interest is mainly due to their size-tunable electronic, optical and chemical properties. For example, many QDs display relatively strong emission in the visible region of the electromagnetic spectrum. Moreover, the wavelength of light absorbed and emitted is a function of the size of the QD. Because of their unique optical properties, QDs are promising materials for commercial applications as diverse as biological labeling, solar cells, catalysis, biological imaging, and light-emitting diodes to name just a few.

To date, the most studied and prepared of semiconductor materials have been the Group II-VI materials, namely, ZnS, ZnSe, CdS, CdSe, CdTe; most noticeably CdSe due to its tuneability over the visible region of the spectrum. Semiconductor nanoparticles are of academic and commercial interest due to their properties, which are unique from the properties of the corresponding crystalline bulk forms of the same semiconductor materials. Two fundamental factors, both related to the size of the individual nanoparticles, are responsible for their unique properties. The first is the large surface-to-volume ratio. As a particle becomes smaller, the ratio of the number of surface atoms to those in the interior increases. This leads to the surface properties playing an important role in the overall properties of small particles. The second factor is that, with semiconductor nanoparticles, there is a change in the electronic properties of the material with the size of the particle. Specifically, the band gap gradually becomes wider as the size of the particle decreases. This change in band gap is because of quantum confinement effects. This effect is a consequence of the confinement of an "electron in a box" giving rise to discrete energy levels similar to those observed in atoms and molecules, rather than a continuous band as in the corresponding bulk semiconductor material. Thus, for a semiconductor nanoparticle, the "electron and hole" produced by the absorption of a photon are closer together than in the corresponding macrocrystalline material, resulting in non-negligible Coulombic interaction between the electron and hole. This leads to a narrow bandwidth emission that is dependent upon the particle size and composition. Consequently, quantum dots have higher kinetic energy than the corresponding macrocrystalline material and the first excitonic transition (band gap) increases in energy with decreasing particle diameter. Thus, quantum dots with a smaller diameter absorb and emit light of higher energy than do quantum dots with a larger diameter. In other words, the color of light absorbed and emitted can be "tuned" as a function of the particle diameter.

Single-core nanoparticles, which consist of a single semiconductor material (typically along with an outer organic passivating layer), tend to have relatively low quantum efficiencies due to electron-hole recombination occurring at defects and dangling bonds situated on the nanoparticle surface that lead to non-radiative electron-hole recombinations. One method of eliminating defects and dangling bonds is to grow a shell comprised of a second semiconductor material having a wider band-gap on the surface of the core particle to produce a "core-shell particle". The shell semiconductor material preferably has a small lattice mismatch with the core material so that the interface between the two materials is minimized. Core-shell particles separate charge carriers confined in the core from surface states that would otherwise act as non-radiative recombination centers. A common example is ZnS grown on the surface of CdSe cores. Excessive strain can further result in defects and non-radiative electron-hole recombination resulting in low quantum efficiencies.

The coordination about the outer inorganic surface atoms is incomplete, with highly reactive "dangling bonds" on the surface, which can lead to particle agglomeration. This problem can be partially overcome by passivating (capping) the "bare" surface atoms with protecting organic groups. The capping or passivating of particles not only prevents particle agglomeration from occurring, it also protects the particle from its surrounding chemical environment and provides electronic stabilization (passivation) to the particles. The capping agent usually takes the form of a Lewis base compound covalently bound to surface metal atoms of the outer most inorganic layer of the particle.

Several synthetic methods for the preparation of semiconductor nanoparticles have been reported. Early routes applied conventional colloidal aqueous chemistry, while more recent methods involve the kinetically controlled precipitation of nanocrystallites, using organometallic compounds.

Since the optical properties of QDs are size-dependent, it is often desirable to produce populations of QDs with a high degree of monodispersity, i.e., with a high degree of uniformity in the size of the QDs in the population. Also, populations of QDs with high quantum yield (QY, the ratio of photons emitted to photons absorbed) are desirable. Methods have been reported to produce semiconductor QDs with high monodispersity and with quantum yields greater than 50%. Most of these methods are based on the original "nucleation and growth" method described by Murray, Norris and M. G. Bawendi, *J. Am. Chem. Soc.* 1993, 115, 8706, incorporated by reference in its entirety, but use other precursors than the organometallic ones used. Murray et al originally used organometallic solutions of metal-alkyls ($R_2M$) M=Cd, Zn, Te; R=Me, Et and tri-n-octylphosphine sulfide/selenide (TOPS/Se) dissolved in tri-n-octylphosphine (TOP). These precursor solutions are injected into hot tri-n-octylphosphine oxide (TOPO) in the temperature range 120-400° C. depending on the material being produced. This produces TOPO-coated/capped semiconductor nanoparticles of Group II-VI material. The size of the particles is controlled by the temperature, concentration of precursor used and length of time at which the synthesis is undertaken, with larger particles being obtained at higher temperatures, higher precursor concentrations and prolonged reaction times. This organometallic route has advantages over other synthetic methods, including near monodispersity and high particle crystallinity.

Cadmium and other restricted heavy metals used in conventional QDs are highly toxic elements and represent a major concern in commercial applications. The inherent toxicity of cadmium-containing QDs precludes their use in applications involving animals or humans. For example recent studies suggest that QDs made of a cadmium chalcogenide semiconductor material can be cytotoxic in a biological environment unless protected. Specifically, oxidation or chemical attack through a variety of pathways can lead to the formation of cadmium ions on the QD surface that can be released into the surrounding environment. Although surface coatings such as ZnS can significantly reduce the toxicity, it may not completely eliminate it because QDs can be retained in cells or accumulated in the body for a long period of time, during which their coatings may undergo some form of degradation exposing the cadmium-rich core.

The toxicity affects not only the progress of biological applications but also other applications including optoelectronic and communication because heavy metal-based materials are widespread in many commercial products including household appliances such as IT and telecommunication equipment, lighting equipment, electrical and electronic tools, toys, leisure and sports equipment. A legislation to restrict or ban certain heavy metals in commercial products has been already implemented in many jurisdictions throughout the world. For example, European Union directive 2002/95/EC, known as the "Restrictions on the use of Hazardous Substances in electronic equipment" (or RoHS), bans the sale of new electrical and electronic equipment containing more than certain levels of lead, cadmium, mercury, hexavalent chromium along with polybrominated biphenyl (PBB) and polybrominated diphenyl ether (PBDE) flame retardants. This law requires manufacturers to find alternative materials and develop new engineering processes for the creation of common electronic equipment. In addition, on 1 Jun. 2007 a European Community Regulation came into force concerning chemicals and their safe use (EC 1907/2006). The Regulation concerns the Registration, Evaluation, Authorization and Restriction of Chemical substances and is known as "REACH". The REACH Regulation imposes greater responsibility on industry to manage the risks associated with chemicals and to provide safety information on the substances. It is anticipated that similar regulations will be promulgated worldwide including China, Korea, Japan and the US. Thus, there are significant economic incentives to develop alternatives to Group II-VI QD materials.

Due to their increased covalent nature, Group III-V and Group IV-VI highly crystalline semiconductor nanoparticles are more difficult to prepare and much longer annealing times are usually required. However, there are now reports of Group III-VI and Group IV-VI materials being prepared in a similar manner to that used for the Group II-VI materials. Examples of such Group III-VI and Group IV-VI materials include GaN, GaP, GaAs, InP, InAs and for PbS and PbSe.

For all of the above methods, rapid particle nucleation followed by slow particle growth is essential for a narrow particle size distribution. All these synthetic methods are based on the original organometallic "nucleation and growth" method by Murray et al., which involves the rapid injection of the precursors into a hot solution of a Lewis base coordinating solvent (capping agent) which may also contain one of the precursors. The addition of the cooler solution subsequently lowers the reaction temperature and assists particle growth but inhibits further nucleation. The temperature is then maintained for a period of time, with the size of the resulting particles depending on reaction time, temperature and the ratio of capping agent to the precursor used. The resulting solution is cooled, followed by the addition of an excess of a polar solvent (methanol or ethanol or sometimes acetone) to produce a precipitate of the particles that can be isolated by filtration or centrifugation. Generally, larger particles precipitate more easily than smaller particles. Thus, precipitation provides a means of separating the quantum dots as a function of their size. Multiple precipitation steps are usually required to achieve narrow particle size distributions.

Fundamentally, these prior art preparations rely on the principle of particle nucleation followed by growth. Moreover, to have a mono-dispersed ensemble of nanoparticles there is preferably proper separation of nanoparticle nucleation from nanoparticle growth with the later occurring at a lower temperature from the former. This is achieved by rapid injection of one or both precursors into a hot coordinating solvent (containing the other precursor if otherwise not present), which initiates particle nucleation. The sudden addition of the cooler solution upon injection subsequently lowers the reaction temperature (the volume of solution added is typically about ⅓ of the total solution) and inhibits further nucleation maintaining a narrow nanoparticle size distribution. This method may work well for small-scale synthesis where one solution can be added rapidly to another while keeping a homogenous temperature throughout the reaction. However, on larger preparative scales, wherein large volumes of solution are required to be rapidly injected into one another, temperature differentials can occur within the reaction, which can lead to a large particle size distribution. Moreover, the need to perform multiple, size-selective, purification steps is not practical for the production of large quantities of QDs.

U.S. Pat. Nos. 7,588,828, 7,803,423, 7,985,446, and 8,062,703 (referred to herein collectively as "the seeding patents") disclose synthetic methods for preparing monodisperse QD populations that do not rely on the hot injection methods and the size-selective purification steps described above. The disclosures of each of these patents are hereby incorporated by reference in their entireties. Briefly, the methods disclosed in these patents involve the use of a molecular cluster "seed" compound that serves as a template for the nucleation of the QD semiconductor material in solution. The cluster compound acts as a seed or nucleation point upon which nanoparticle growth can be initiated. In this way, a high temperature nucleation step is not necessary to initiate nanoparticle growth because suitable nucleation sites are already provided in the system by the molecular clusters. By providing nucleation sites that are more uniform than the nucleation sites employed in the methods described above, the synthesis provides a population of QDs that are essentially monodisperse. A significant advantage of the molecular seeding method is that it can be easily scaled-up.

The seeding methods described in the seeding patents can be used to make Group II-VI QDs and can also be used to make Group III-V and Group IV-VI QDs. But as mentioned above, the Group III-V and Group IV-VI QDs can be difficult to work with. Because of the high surface area-to-volume ratio, atoms on the surface of small QDs tend to diffuse from the surface of the smaller particles to the surface of the larger particles, a process known as Ostwald ripening. QDs of Group III-V materials such as InP and alloys thereof tend to be particularly unstable due to Ostwald ripening. Because Ostwald ripening decomposes the smaller QDs and promotes the growth of larger QDs, this process makes it difficult to obtain QDs that emit at shorter wavelengths, i.e., that emit in the blue and green regions of the visible spectrum.

There is thus a need in the art for improved synthetic methods of producing cadmium-free QDs that emit the shorter wavelengths of visible light.

BRIEF SUMMARY OF THE INVENTION

The methods and compositions disclosed herein overcome the problems described above by providing a heavy metal-free QD material that emits light in the green region of the spectrum but that is more stable to Ostwald ripening than the InP-based QDs known in the art. The QD compositions are obtained by incorporating ions such as zinc, aluminum, or magnesium into the QD core.

The foregoing summary is not intended to summarize each potential embodiment or every aspect of the present disclosure.

BRIEF DESCRIPTION OF THE SEVERAL VIEWS OF THE DRAWING(S)

DETAILED DESCRIPTION OF THE INVENTION

Figure 1:
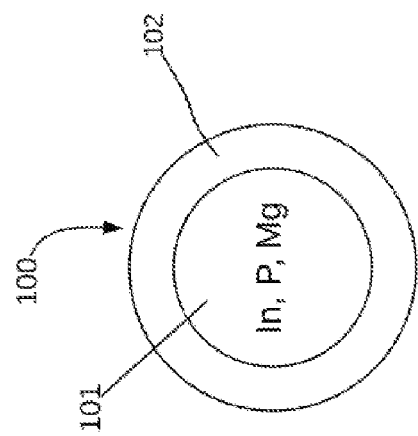
FIG. 1 is a schematic, cross-sectional view of a core-shell QD having a core that includes indium, magnesium, and phosphorus ions.

FIG. 1 illustrates a core-shell QD 100 having a core 101 of a semiconductor material that includes indium, magnesium, and phosphorus ions. Ions such as zinc and/or aluminum may be included in addition to, or in place of, magnesium. The core may further include other ions, such as selenium, and/or sulfur. The core 101 is coated with one (or more) shells of semiconductor material. The shell semiconductor material(s) may be essentially any semiconductor material known in the art as a shell material for QDs. Example shell semiconductor materials include semiconductors containing zinc, sulfur, selenium, iron and/or oxygen ions.

While FIG. 1 illustrates a distinct boundary between core 101 and shell 102, it should be appreciated that such a distinct boundary may not exist. Instead, there may be appreciable alloying between the core and shell materials such that there is a gradient of materials at the boundary as the core material transitions to the material of the innermost shell. Likewise, if the QD contains multiple shells, significant alloying may occur at the boundaries between shells. It will also be appreciated that the outermost surface of QD 100 is most likely coated with capping ligands, as discussed in the Description of the Related Art section, above.

As explained above, incorporating magnesium into the InP-based core provides bulk to the semiconductor core without significantly altering its band structure. Therefore, the stability of the core material is enhanced due to a lower surface/volume ratio, but the optical properties (i.e., absorption/emission) still correspond to that of a smaller InP core.

Generally any method described in the art for synthesizing InP-based QDs can be adapted to incorporate magnesium into the semiconductor material. One particularly suitable method for synthesizing an InP-based core is the molecular seeding method described in the seeding patents, referenced above. Briefly, the method involves reacting core material precursors in the presence of a molecular seeding compound, as illustrated in step 201 of FIG. 2. Suitable precursor compounds for an InP-based core must provide a source of indium and a source of phosphorus. For example, the indium source may be indium myristate and the phosphorus source may be tris(trimethylsilyl)phosphine. It will be appreciated that other indium and phosphorus sources may be used.

Further, a magnesium source is required to incorporate magnesium into the InP-based core. A suitable magnesium source is magnesium myristate.

The core-forming reaction may be conducted in the presence of a molecular seeding compound. Suitable molecular seeding compounds are described at length in the co-owned patents referenced above. One example of a suitable molecular seeding compound is the zinc sulfide-based molecular seeding compound described in U.S. Pat. No. 8,062,703 (the entire contents of which are incorporated by reference).

The core precursor compounds and the molecular seeding compound are heated in a solvent under conditions described in the seeding patents and in U.S. Patent Publication No. 2010/0068522, filed Aug. 7, 2009, the entire contents of which are hereby incorporated by reference. Generally, a non-electron donating solvent is used for the reaction. One example of an appropriate solvent is THERMINOL® 66 heat transfer fluid (Solutia, Inc., St. Louis, Miss. 63141) which comprises a hydrogenated terphenyl.

Figure 2:
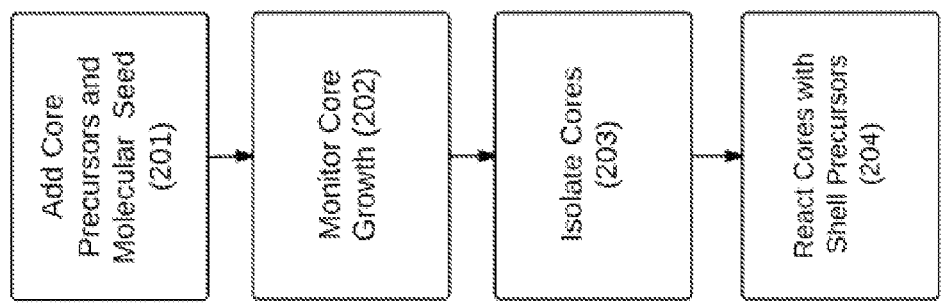
FIG. 2 is a simplified flow chart illustrating the synthesis of a core-shell QD having a core including indium, magnesium, and phosphorus ions.

As illustrated in FIG. 2, it may be desirable to monitor an optical property 202 of the QD core during the synthesis of the core. For example, the absorbance spectrum may be monitored as the QD core grows and the reaction may be stopped when the core reaches the proper size to yield the desired absorbance and/or emission spectrum. Once the desirable optical value is obtained and the reaction stopped, the cores can be isolated 203, for example, by filtration. It may be desirable to add a non-solvent to the reaction mixture to induce precipitation of the cores. Once the cores are isolated, they may be reacted with shell precursors 204 to grow one or more semiconductor shells on the cores. It may be desirable to pretreat the cores, for example, by etching a small amount of the material from the core, prior to reacting the core with the shell precursors. An acid, such as hydrofluoric acid may be used to etch the core.

The following examples illustrate representative embodiments of processes for preparing QDs, as disclosed herein.

EXAMPLES

Example 1

Magnesium-Containing Cores

Figure 3:
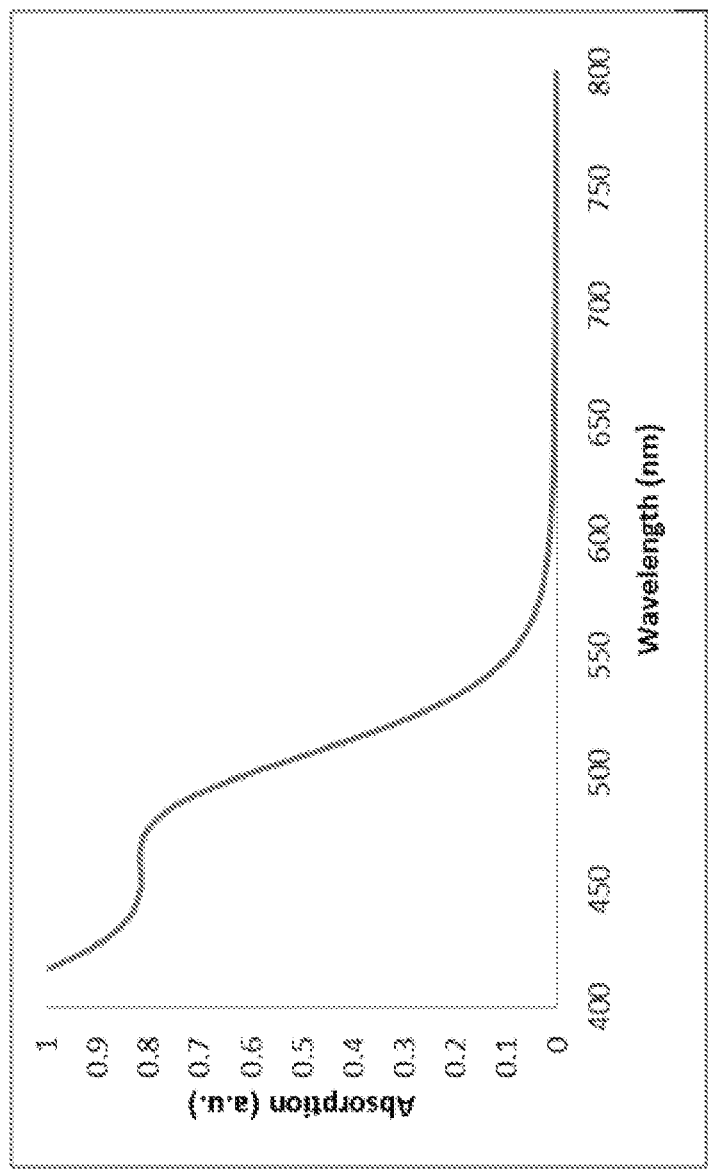
FIG. 3 is the absorption spectrum of a core QD containing indium, magnesium, and phosphorus ions.

Magnesium myristate was prepared by heating magnesium acetate tetrahydrate (2.92 g) and myristic acid (12.4 g) to 110° C. under vacuum until the solution went clear and no further liquid was evolved. This magnesium myristate was used as prepared in the following synthesis: Indium myristate (4.55 g), magnesium myristate (2.33 mL), myristic acid (0.76 g), and Therminol 66 (50 mL) were placed in a dried 250 mL round bottomed flask equipped with an air condenser, nitrogen inlet, suba seal, thermocouple, and stirrer bar and degassed under vacuum at 100° C. for 1 hour. The reaction was then placed under a nitrogen atmosphere and zinc sulfide cluster (1.35 g, prepared as described in U.S. Pat. No. 8,062,703) was added. The reaction was then degassed under vacuum for a further ½ hour and then placed under a nitrogen atmosphere. A solution of tris(trimethylsilyl)phosphine (1 M in diphenyl ether) was added dropwise in portions whilst increasing the temperature as follows: at 100° C. 2.25 mL were added, at 160° C. 3 mL were added, and at 230° C. 4 mL were added. The reaction was held at this temperature for 24 hours and then allowed to cool to room temperature. It was then subsequently reheated to 300° C. for ½ hour before cooling to room temperature. The absorption spectrum of the resulting InP-based core containing magnesium is illustrated in FIG. 3.

The reaction solution was diluted with chloroform (100 mL) and photo-etched with hydrofluoric acid over a period of 26 hours. The etched nanoparticles were isolated by the addition of methanol.

The etched cores thus obtained were then overcoated with a zinc sulfide and zinc oxide shell as follows: Etched cores (0.2 g), Therminol 66 (20 mL), and dibutyl sebacate (20 mL) were placed in a dried 250 mL round bottomed flask equipped with an air condenser, nitrogen inlet, suba seal, thermocouple, and stirrer bar and degassed under vacuum at 80° C. for 1 hour. The reaction was then placed under a nitrogen atmosphere and zinc acetate (4.12 g) was added. The reaction was then degassed under vacuum for a further ½ hour and then placed under a nitrogen atmosphere. The reaction was heated to 210° C., held for 2 hours, heated to 230° C., dodecanethiol (2.6 mL) was added, and the reaction held for 1 hour. After this time, the temperature was lowered to 180° C., octanol (1.7 mL) added, the reaction held for ½ hour, and cooled to 60° C. The product was isolated by addition of acetone (40 mL), separated by centrifuge (4000 rpm, 3 minutes), and then washed with methanol and dissolved in toluene. The optical properties of the resultant nanoparticles were: emission maximum 523 nm, FWHM 57 nm, and quantum yield 74%.

Example 2

Zinc and Magnesium-Containing Cores

Indium myristate (11.74 g), zinc acetate (0.734 g), magnesium stearate (0.591 g), and myristic acid (1.507 g) were stirred in 100 mL of Therminol 66 and heated to 100° C. Zinc sulfide cluster (2.7 g, prepared as described in U.S. Pat. No. 8,062,703) was added. Trimethylsilyl phosphine (18.5 mmol) was added at a rate of 7.2 mL/hour and the reaction mixture was heated to 195° C. and allowed to anneal for 140 hours.

Example 3

Zinc and Aluminum-Containing Cores

Indium myristate (11.74 g), zinc acetate (0.734 g), aluminum stearate (0.877 g), and myristic acid (1.507 g) were stirred in 100 mL of Therminol 66 and heated to 100° C. Zinc sulfide cluster (2.7 g, prepared as described in U.S. Pat. No. 8,062,703) was added. Trimethylsilyl phosphine (18.5 mmol) was added at a rate of 7.2 mL/hour and the reaction mixture was heated to 195° C. and allowed to anneal for 140 hours.

Example 4

Zinc-Containing Cores

Indium myristate (11.74 g), zinc acetate (0.734 g), and myristic acid (1.507 g) were stirred in 100 mL of Therminol 66 and heated to 100° C. Zinc sulfide cluster (2.7 g, prepared as described in U.S. Pat. No. 8,062,703) was added. Trimethylsilyl phosphine (18.5 mmol) was added at a rate of 7.2 mL/hour and the reaction mixture was heated to 195° C. and allowed to anneal for 140 hours.

Example 5

Zinc and Calcium-Containing Cores

Indium myristate (11.74 g), zinc acetate (0.734 g), calcium stearate (0.607 g), and myristic acid (1.507 g) were stirred in 100 mL of Therminol 66 and heated to 100° C. Zinc sulfide cluster (2.7 g, prepared as described in U.S. Pat. No. 8,062,703) was added. Trimethylsilyl phosphine (18.5 mmol) was added at a rate of 7.2 mL/hour and the reaction mixture was heated to 250° C. and allowed to anneal for 40 hours.

The foregoing description of preferred and other embodiments is not intended to limit or restrict the scope or applicability of the inventive concepts conceived by the Applicants. It will be appreciated that, with the benefit of the present disclosure, features described above in accordance with any embodiment or aspect of the disclosed subject matter can be utilized, either alone or in combination, with any other described feature, in any other embodiment or aspect of the disclosed subject matter. Those skilled in the art will understand that various changes and modifications may be made without departing from the scope of the present invention as literally and equivalently covered by the following claims.

What is claimed is:

1. A method of making a semiconductor nanoparticle, comprising:
   combining an indium source precursor and at least two metal source precursors selected from the group consisting of magnesium source precursors, aluminum source precursors, calcium source precursors and zinc source precursors in a solvent at a first temperature to form a mixture;
   adding a molecular seeding compound to the mixture at the first temperature to form a molecular seeding compound-containing mixture;
   adding a phosphorus source precursor to the molecular seeding compound-containing mixture to form a semiconductor nanoparticle precursor mixture;
   heating the semiconductor nanoparticle precursor mixture to a second temperature; and
   annealing the semiconductor nanoparticle precursor mixture at the second temperature.

2. The method recited in claim 1, wherein the first temperature is 100° C.

3. The method recited in claim 1, wherein the second temperature is from 195° C. to 250° C.

4. The method recited in claim 1, wherein the ratio of the indium to the at least two additional metals is about 3:1 to about 4:1.

5. The method recited in claim 1, wherein the molecular seeding compound is zinc sulfide.

* * * * *